(12) United States Patent
Houston

(10) Patent No.: US 6,376,344 B1
(45) Date of Patent: Apr. 23, 2002

(54) SEMICONDUCTOR DEVICE WITH FULLY SELF-ALIGNED LOCAL INTERCONNECTS, AND METHOD FOR FABRICATING THE DEVICE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/661,659

(22) Filed: Sep. 14, 2000

Related U.S. Application Data
(60) Provisional application No. 60/161,651, filed on Oct. 20, 1999.

(51) Int. Cl.[7] .............................................. H01L 21/425
(52) U.S. Cl. ..................... 438/533; 438/622; 438/624; 438/626; 438/631; 438/633; 438/634
(58) Field of Search ................................. 438/533, 622, 438/624, 626, 631, 633, 634

(56) References Cited

U.S. PATENT DOCUMENTS 6,118,161 A * 9/2000 Chapman et al. ........... 257/401
6,225,211 B1 * 5/2001 Tsai .......................... 438/624

* cited by examiner

Primary Examiner—David Nelms
Assistant Examiner—Renee R. Berry
(74) Attorney, Agent, or Firm—Michael K. Skrehot; W. James Brady, III; Frederick J. Telecky, Jr.

(57) ABSTRACT

A semiconductor device and a method of making it involve the semiconductor device (10, 71, 101, 121, 151, 201) having a substrate (11, 73, 153) with spaced source and drain regions (13–14, 76–78, 154). A gate section (21, 81–82, 123, 203) projects upwardly from between an adjacent pair of the regions, into an insulating layer (31, 83, 103, 122, 157). In order to create local interconnects to the source and drain regions through the insulating layer, a patterned etch is carried out using an etch region (36, 87, 126), which extends over one of the gate sections from a location above one of the regions to a location above another of the regions. Etching in this etch region produces recesses (41–42, 91–93, 107–108, 138–139, 158) on opposite sides of and immediately adjacent the gate section. A conductive layer (51, 96, 111, 161, 171) is deposited to fill the recesses, and then is planarized back to the upper ends of the gate sections. The conductive material remaining in each recess is self-aligned to be immediately adjacent at least one gate section, and serves as a local interconnect for a respective source or drain region.

17 Claims, 9 Drawing Sheets

SEMICONDUCTOR DEVICE WITH FULLY SELF-ALIGNED LOCAL INTERCONNECTS, AND METHOD FOR FABRICATING THE DEVICE

This application claims priority under 35 USC § 119(e)(1) of provisional application Nos. 60/161,651 filed Oct. 20, 1999.

CROSS-REFERENCE TO RELATED APPLICATION

This application is related to a co-pending application entitled "SEMICONDUCTOR DEVICE WITH FULLY SELF-ALIGNED LOCAL INTERCONNECTS, AND METHOD FOR FABRICATING THE DEVICE".

TECHNICAL FIELD OF THE INVENTION

This invention relates in general to a semiconductor device and a method of fabricating it and, more particularly, to a semiconductor device with local interconnects that are fully self-aligned with respect to a gate section, and a method of making such device.

BACKGROUND OF THE INVENTION

In one known type of integrated circuit, fabrication of a metal oxide semiconductor field effect transistor (MOSFET) is carried out in the following manner. A p-type silicon substrate has spaced n+type source and drain regions formed adjacent an upper surface of the substrate. The source and drain regions have respective upwardly facing surface portions thereon, which are each a respective portion of the overall upper surface of the substrate. A gate section is formed to project upwardly from a location between the surface portions which are on the source and drain regions. The gate section includes a gate dielectric layer disposed on the substrate, a gate electrode disposed on the gate dielectric layer, and an insulating layer disposed on the gate electrode. Insulating sidewalls are provided on opposite sides of the gate dielectric layer, gate electrode and insulating layer. A dielectric layer is formed over the substrate and gate section, with an upper surface which is at a level higher than the upper end of the gate section.

Then, in order to create local interconnects to the source and drain regions, a patterned etch is carried out using a selective etching technique, with an etch mask that includes two spaced etch regions which each correspond to a respective one of the source region and drain region. During etching, each etch region results in the creation of a respective recess extending downwardly through the dielectric layer to the surface portion on top of one of the source region or drain region. Subsequently, a layer of a conductive material is deposited on the device in order to fill the recesses, and then is planarized to the top of the dielectric layer, so that the portions of the conductive material which remain in the recesses serve as local interconnects for the source and drain regions.

A consideration involved in using this known fabrication technique is that it is very difficult to precisely align the etch mask with the device, in particular so that the two etch regions are each properly positioned over a respective one of the source and drain regions. This difficulty is due in part to the fact that the level of integration has been progressively increasing over recent years, but alignment techniques do not scale the same as the actual circuit geometry, because alignment techniques involve mechanical considerations, whereas scaling of the circuit geometry involves optical considerations. These considerations affect the spacing between the two etch regions. It would ideally be desirable that the two etch regions be spaced by a distance equal to the width of the gate section so that, in a situation where the two etch regions both happen to be properly positioned, the adjacent sides of the etch regions would each be disposed directly above a respective side edge of the gate section, and the resulting recesses would each be immediately adjacent the gate section with no intervening dielectric material. In actual practice, however, due to potential problems associated with possible mispositioning, the two etch regions have between them a spacing which is somewhat greater than the width of the gate section. Thus, in a situation where these two etch regions both happen to be properly positioned, the adjacent sides of the etch regions will each be disposed a small distance outwardly from a respective side edge of the gate section, and the two resulting recesses will each be spaced a small distance from the gate section, with some dielectric material between each recess and the gate section.

Usually, of course, the two etch regions are not perfectly positioned with respect to the gate section, because there is a physical offset between the actual position and the desired position of the mask relative to the device. Consequently, when the offset is present, one of the two etch regions will typically have an edge portion that overlaps slightly with the gate section, and the other etch region will be spaced slightly from the gate section. As a result, one of the resulting recesses will be immediately adjacent the gate section, whereas the other will be spaced slightly from the gate section with intervening dielectric material.

In order to compensate for such an offset in the etch mask, and the added spacing between the etch regions, while ensuring that the necessary contact area exists between each local interconnect and the associated source or drain region, the known process fabricates each of the source and drain regions with a size which is larger than would otherwise be necessary. In an integrated circuit with a number of such MOSFET devices, the overall integrated circuit must be somewhat larger than if the source and drain regions were of ideal size, and for example may be as much as 15% to 25% larger. This in turn results in the integrated circuit having a lower circuit density than would be desirable. Moreover, since each of the source and drain regions are larger than necessary, the result is larger junction areas, larger junction capacitances, larger junction leakage currents, and larger source and drain resistances. Consequently, while this known technique for forming local interconnects has been generally adequate for its intended purposes, it has not been satisfactory in all respects.

SUMMARY OF THE INVENTION

From the foregoing, it may be appreciated that a need has arisen for an integrated circuit having two local interconnects that are self-aligned with respect to a section of the device which is disposed between them so as to permit a reduction in the size of the integrated circuit, and a method of making such a device.

According to one form of the present invention, a method is provided to address this need, and involves: fabricating a structure that has laterally spaced first and second sections with respective upwardly facing first and second surface portions thereon, and that has a third section projecting upwardly beyond each of the first and second surface portions from a location therebetween; forming on the structure an insulating layer which has portions disposed over the first and second surface portions, the third section extending into the insulating layer; effecting a patterned etching of an upper side of the insulating layer using an etch pattern, the etch pattern including an etch region which extends from a location disposed over the first surface portion to a location disposed over the second surface portion, wherein etching in the etch region creates first and second recess portions which respectively extend downwardly through the insulating layer toward the first and second surface portions on opposite sides of the third section; depositing a conductive material into the first and second recess portions; and planarizing an upper side of the device to a level corresponding to an upper end portion of the third section.

According to another form of the present invention, an apparatus is provided to address the need discussed above, and includes: laterally spaced first and second sections with respective upwardly facing first and second surface portions thereon; a third section projecting upwardly beyond each of the first and second surface portions from a location therebetween; an insulating layer which has portions disposed over the first and second surface portions, the third section extending into the insulating layer, and the insulating layer having first and second recess portions which respectively extend downwardly through the insulating layer toward the first and second surface portions on opposite sides of the third section, each such recess portion being immediately adjacent a respective side of the third section and having therein a conductive material.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
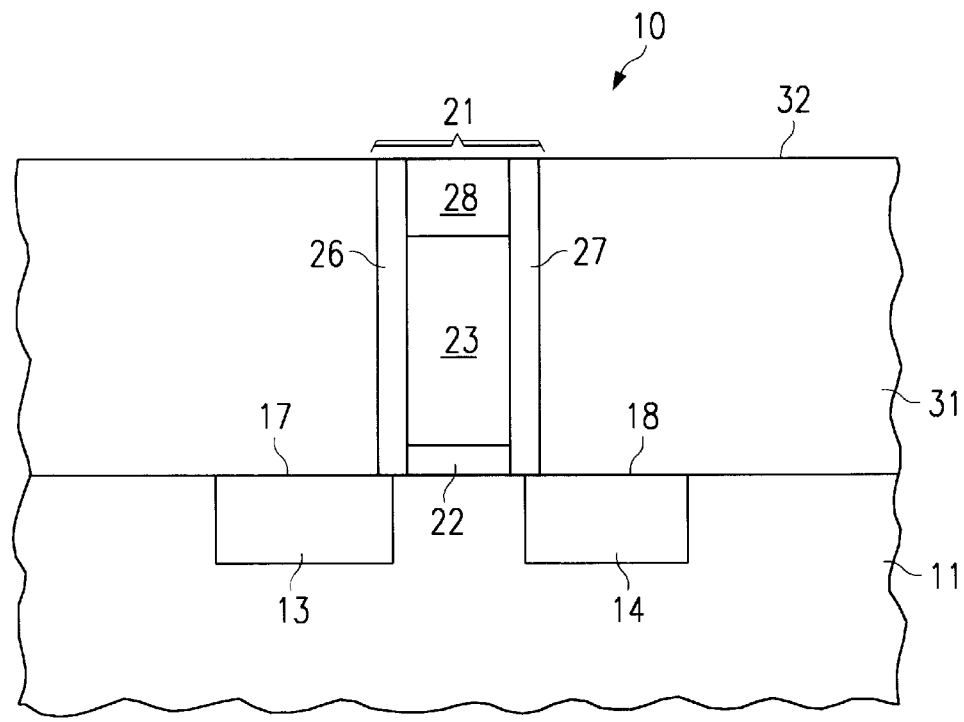
FIG. 1 is a diagrammatic sectional side view of part of an integrated circuit, showing its configuration at an intermediate stage of its fabrication according to a method which embodies the present invention.

FIG. 1 is a diagrammatic sectional side view of a portion of a semiconductor device 10 which embodies the present invention. FIG. 1 shows the device 10 as it appears at an intermediate stage during its fabrication process.

At the stage of fabrication shown in FIG. 1, the device 10 includes a semiconductor substrate 11, which may for example be a p-type silicon material, the substrate 11 having spaced source and drain regions 13 and 14 adjacent its upper surface. The source and drain regions 13–14 may each be an n+region. The source and drain regions 13–14 have upwardly facing surface portions 17 and 18 on the upper side thereof, the surface portions 17–18 each being a portion of the overall upper surface of the substrate 11.

The device 10 further includes a gate section 21 which is provided on and projects upwardly from the upper surface of the substrate 11, in particular from a location between the surface portions 17–18. The gate section 21 includes a gate dielectric layer 22 provided on the silicon substrate 11 between the source and drain regions 13–14. In the disclosed embodiment, the gate dielectric layer 22 is silicon dioxide. A gate electrode 23 is provided on the gate dielectric layer 22. In the disclosed embodiment, the gate electrode 23 is an n+doped polysilicon material. The gate section 21 also includes, on the upper side of the gate electrode 23, an insulating layer 28. In the disclosed embodiment, the insulating layer 28 is made of a nitride such as $Si_3N_4$. The gate section 21 further includes two spaced insulating sidewalls 26 and 27, which have between them the dielectric layer 22, gate electrode 23 and insulating layer 28. The sidewalls 26–27 are also made of a nitride such as $Si_3N_4$.

Following formation of the gate section 21, an insulating pre-metal dielectric (PMD) layer 31 is applied over the top of the substrate 11 and gate section 21. In the disclosed embodiment, the PMD layer 31 is silicon dioxide. The top surface of the layer 31 is initially higher than and covers the gate section 21, but has been planarized back to a level 32 which corresponds to the upper end of the gate section 21. The layer 31 engages the surface portions 17–18 on the source and drain regions 13–14, and also engages the sidewalls 26–27. At this point, an opening may be etched through the nitride insulating layer 28 at a location therealong which is spaced from the plane of FIG. 1 in a direction normal to that plane, in order to allow an electrical connection to be made to the gate electrode 23.

Those skilled in the art will recognize that the gate section 21, together with the source and drain regions 13–14, define a metal oxide semiconductor field effect transistor (MOSFET). Although the present invention is described in the specific context of a MOSFET, this is only by way of example. The method according to the present invention is not limited to use with MOSFETs, and could be used to fabricate other circuit components.

Once the device 10 has reached the stage of fabrication shown in FIG. 1, the next step according to the invention is to carry out a patterned etch of the dielectric layer 31, in order to form recesses or trenches which will contain local interconnects or contacts for the source and drain regions 13–14. This patterned etch is explained in more detail with reference to FIG. 2, which is a diagrammatic top view of the device 10 of FIG. 1.

Figure 2:
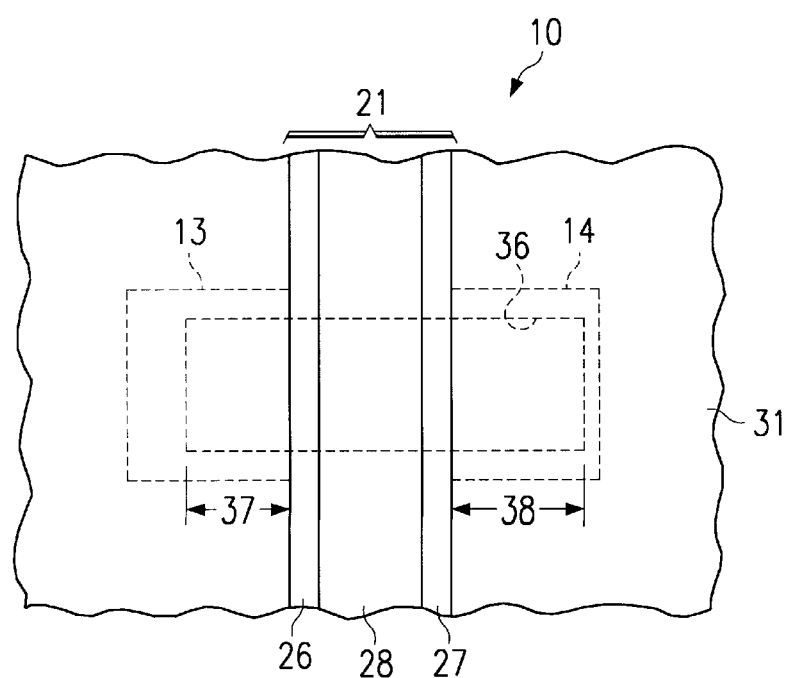
FIG. 2 is a diagrammatic top view of the integrated circuit of FIG. 1, and shows an etch mask which is used during fabrication of the integrated circuit according to the inventive method.

FIG. 2 shows in broken lines a rectangular etch region 36, where etching will be carried out inside the boundary of the region 36, and where etching will be prevented in areas immediately outside the region 36. It will be noted that the etch region 36 has its opposite end portions respectively disposed over the source and drain regions 13–14, and has a center portion which is disposed over the gate section 21. It will also be noted that the etch region 36 has a slight misalignment or offset with respect to the device 10, for example as evident from the fact that arrow 37 is shorter than arrow 38. The misalignment shown in FIG. 2 represents a physical offset between the device 10 and the mask used for the patterned etch. Viewed differently, the actual position of the mask is offset from a desired position relative to the device 10, due to practical limitations in the ability to accurately align the mask relative to the device. The misalignment shown in FIG. 2 is one example of possible misalignment, which is illustrative for purposes of the present invention.

The patterned etch is then carried out using this mask, so that etching occurs within the region 36. In more detail, the etching is a selective etching according to a known technique, which removes the silicon dioxide material of the dielectric layer 31, but not the nitride material forming the sidewalls 26–27 and the insulating layer 28.

Figure 3:
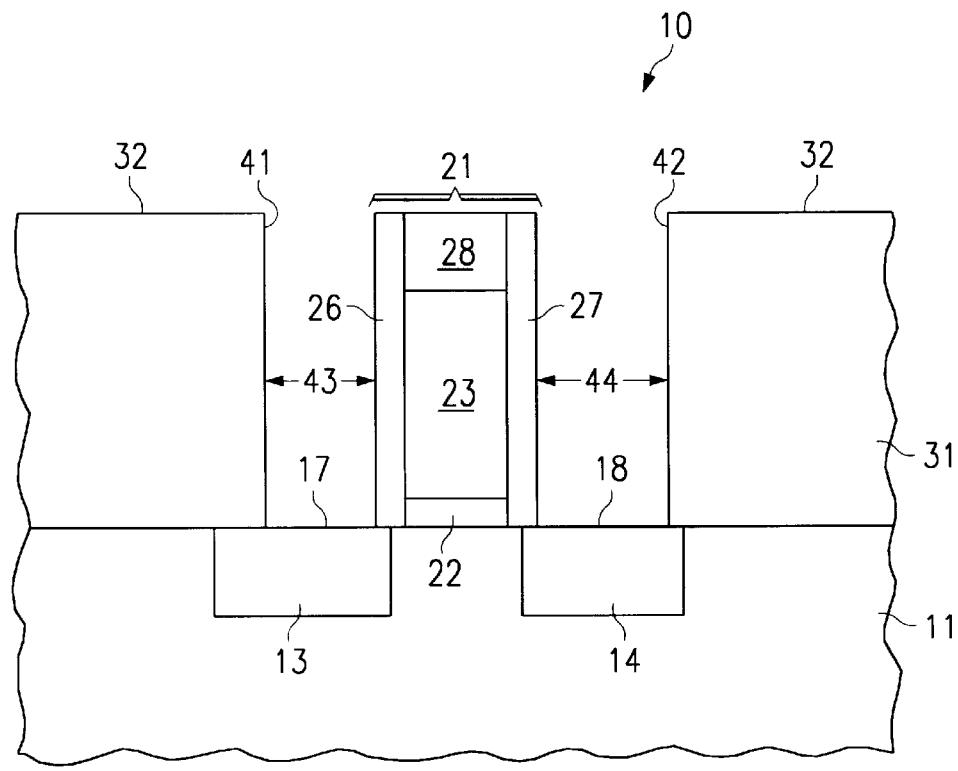
FIG. 3 is a diagrammatic sectional side view similar to FIG. 1, but showing the integrated circuit at a later stage in the fabrication process.

FIG. 3 is a diagrammatic sectional side view similar to FIG. 1, but showing the device 10 after completion of the patterned etch. The result of the patterned etch is two recesses 41 and 42 in the dielectric layer 31, which extend downwardly on opposite sides of the gate section 21. It should be noted that, even though the etch mask was misaligned with respect to the device 10, each of the recesses 41 and 42 is immediately adjacent the gate section 21, with no residual dielectric material between the gate section 21 and either of the recesses 41 and 42. In accord with the present invention, this will be true even if the width of the gate section 21 represents the shortest gate length present in the entire integrated circuit. The recesses 41–42 extend to the surface portions 17–18, respectively. As evident from the length of arrows 43 and 44 in FIG. 3, which respectively correspond in length to arrows 37 and 38 in FIG. 2, it will be noted that the recess 41 is wider than the recess 42. After completion of the patterned etch, the mask defining the etch region 36 is removed from the surface 32 using known techniques.

Figure 4:
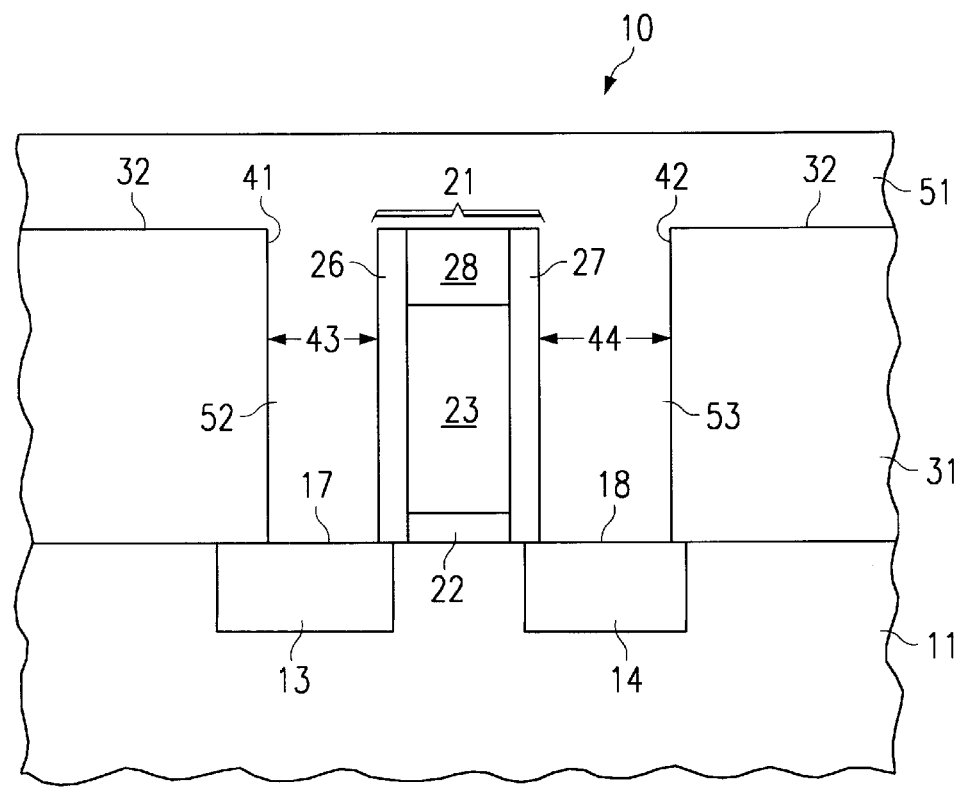
FIG. 4 is a diagrammatic sectional side view similar to FIG. 3, but showing the integrated circuit at a still later stage during its fabrication.
Figure 5:
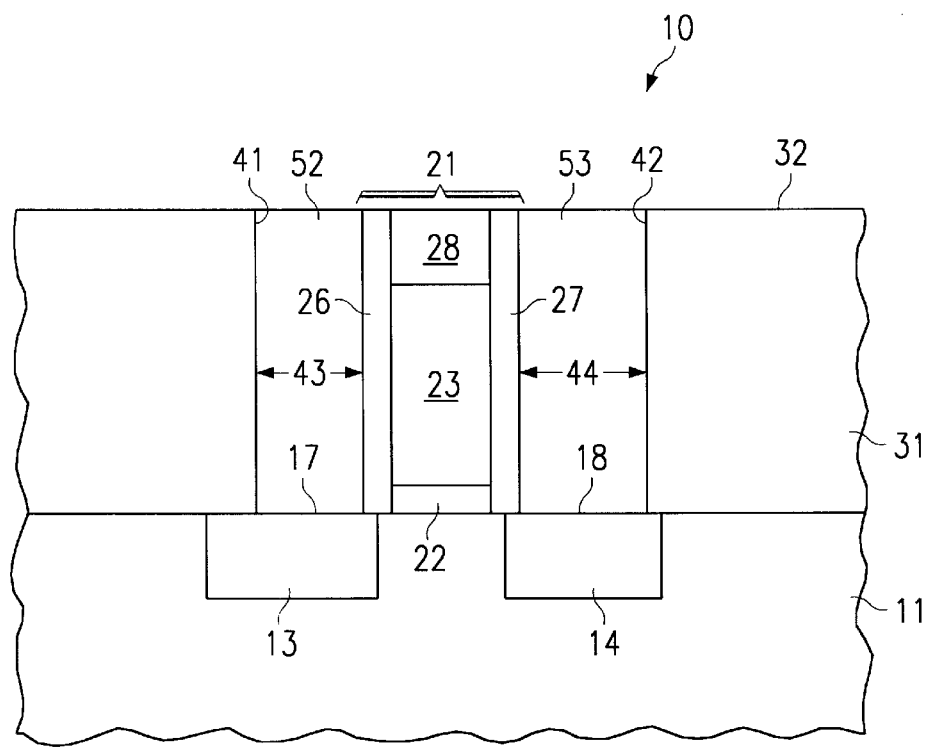
FIG. 5 is a diagrammatic sectional side view similar to FIG. 4, but showing the integrated circuit at yet a later stage during its fabrication.

With reference to FIG. 4, the next step in the process is to deposit a layer of conductive material 51 such as tungsten on the upper side of the device 10. The conductive layer 51 has portions 52 and 53 which respectively extend into the recesses 41–42, and which respectively engage the surface portions 17–18 on the source and drain regions 13–14. The conductive material 51 is then planarized back to a level that corresponds to the surface 32 and the upper end of the gate section 21, so that the resulting structure is as shown in FIG. 5. This planarization step may be carried out using either a known chemical mechanical polishing (CMP) technique, or using a known etching technique. Use of an etch is simpler here than use of a CMP, because the dielectric layer 31 is planarized to the level 32 before the conductive layer 51 is deposited. However, the invention encompasses the use of either technique.

Referring to FIG. 5, it will be noted that the portions 52–53 of the conductive material are electrically isolated from each other, and each engage a respective one of the surface portions 17–18 on the source and drain regions 13–14. Further, the conductive portions 52–53 each extend upwardly to a level which corresponds to the upper end of gate section 21 and the surface 32 on layer 31. It should also be noted that the conductive portions 52–53 are each immediately adjacent a respective one of the nitride sidewalls 26–27, with no intervening residual material from the dielectric layer 31. The conductive portions 52–53 serve as local interconnects or contacts, which provide an electrical connection between the source and drain regions 13–14 and a not-illustrated metalization layer which will be added on top of the device 10 during subsequent processing. Optionally, a further dielectric layer (not illustrated) may be provided between the layer 31 and the first metalization layer, and openings may be etched therethrough and then filled with a conductive material, in order to provide electrical connections between the conductive portions 52–53 and the metalization layer.

Figure 6:
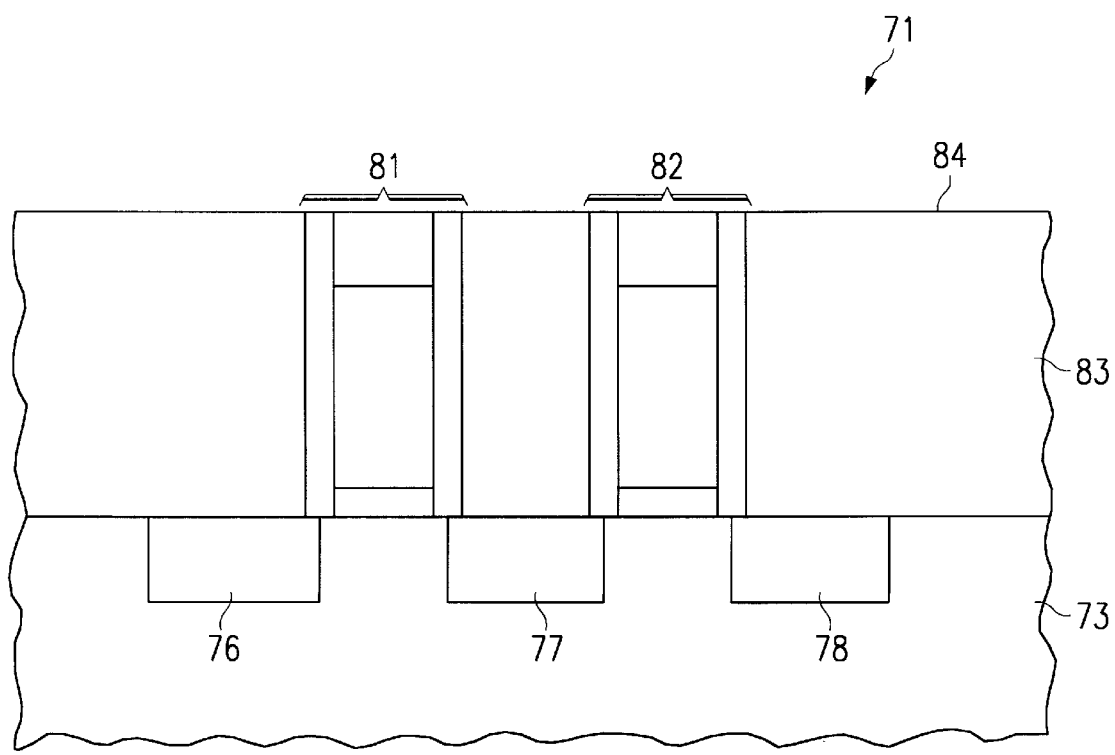
FIG. 6 is a diagrammatic sectional side view of an integrated circuit which is an alternative embodiment of the integrated circuit of FIGS. 1–5 and which is fabricated according to a method that is an alternative embodiment of the method of FIGS. 1–5, the integrated circuit of FIG. 6 being shown at an intermediate stage during its fabrication.

FIGS. 6–9 show a device 71 which is a structural variation of the device 10 shown in FIGS. 1–5. The fabrication process used in association with the device 71 is substantially the same as that described above in association with FIGS. 1–5. With reference to FIG. 6, the device 71 includes a p-type substrate 73 having three spaced n+regions 76–78. Two gate sections 81 and 82 project upwardly from the substrate 73, and are each structurally equivalent to the gate section shown at 21 in FIG. 1. The gate section 81 projects upwardly from a location between the regions 76–77, and the gate section 82 projects upwardly from a location between the regions 77–78. A pre-metal dielectric layer 83 of silicon dioxide has been deposited over the substrate 73 and the gate sections 81–82, and has been planarized back to a level 84 which corresponds to the upper ends of the gate sections 81–82.

Figure 7:
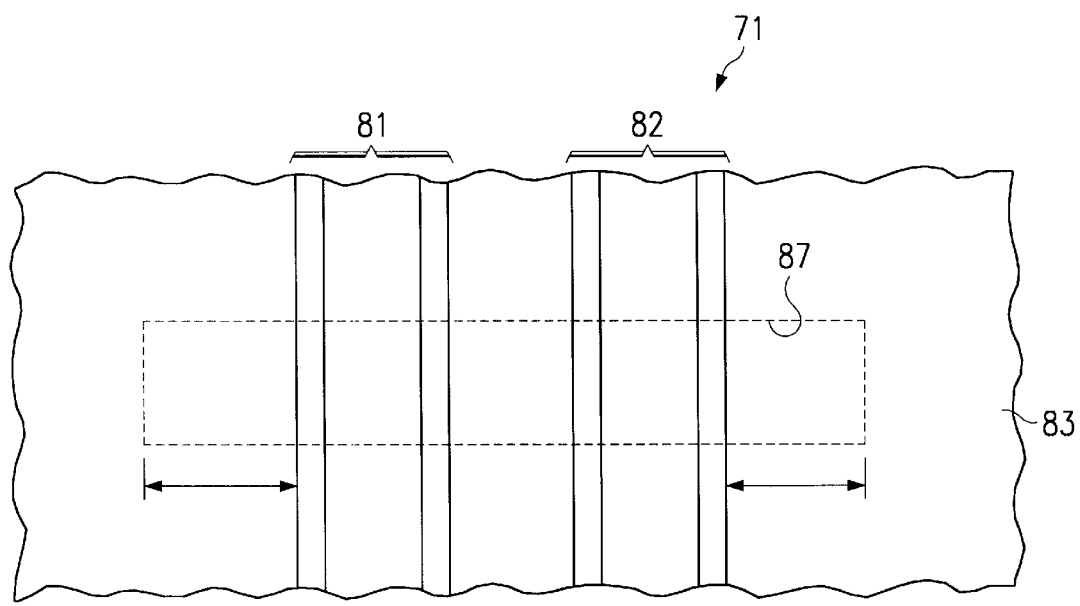
FIG. 7 is a diagrammatic top view of the integrated circuit of FIG. 6, and also depicts an etch mask which is used during fabrication of this integrated circuit according to the method embodying the present invention.
Figure 8:
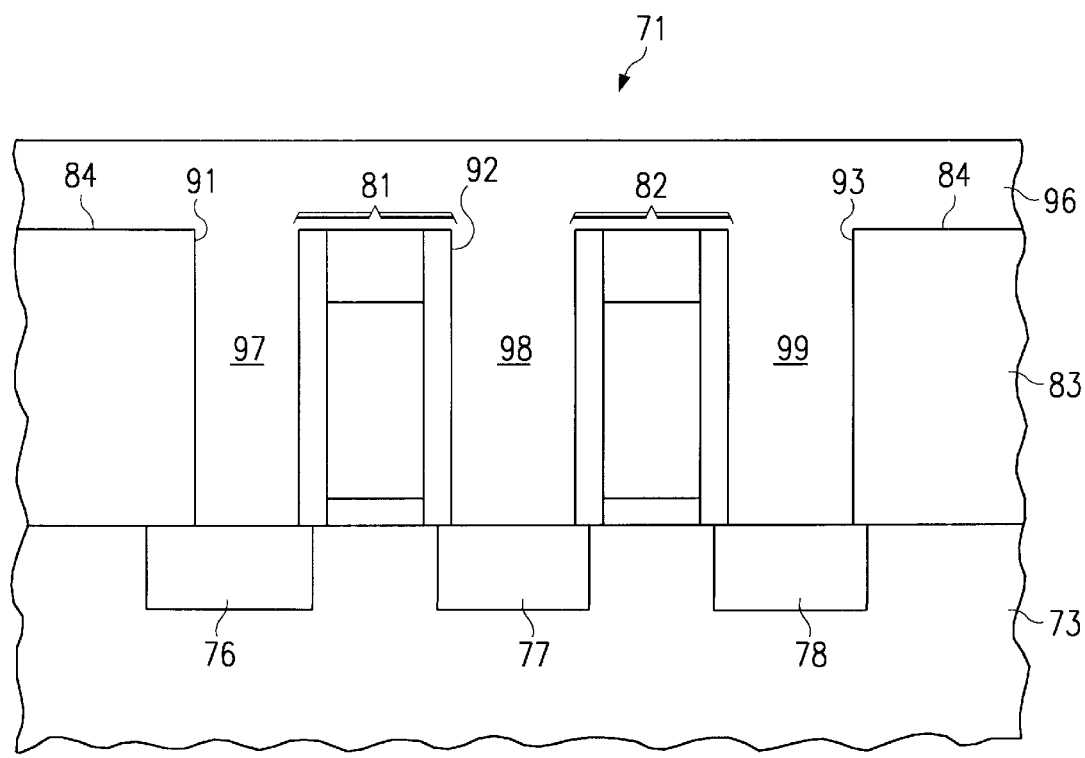
FIG. 8 is a diagrammatic sectional side view similar to FIG. 6, but showing the integrated circuit of FIG. 6 at a later stage during its fabrication.
Figure 9:
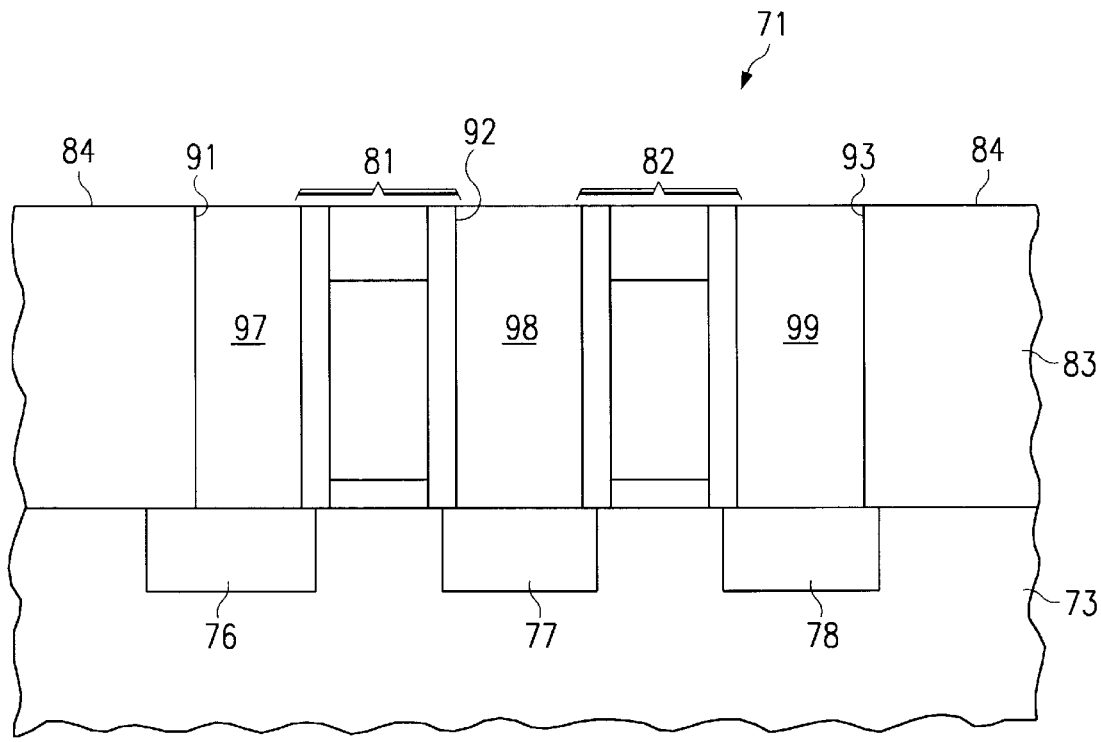
FIG. 9 is a diagrammatic sectional side view similar to FIG. 8, but showing the integrated circuit at yet a later stage during its fabrication.

FIG. 7 is a diagrammatic top view similar to FIG. 2, but showing the device 71 of FIG. 6. FIG. 7 shows in broken lines a single continuous rectangular etch region 87, which has one end disposed over the region 76 (FIG. 6), which has its other end disposed over the region 78 (FIG. 6), and which has a center portion disposed over the region 77 (FIG. 6). A patterned etch is carried out in order to remove material of the dielectric layer 83 but not material of the gate sections 81–82, after which the mask is removed in a known manner. Following the patterned etch, the dielectric layer 83 of the device 71 appears as shown in FIG. 8, and has three recesses 91–93 which are respectively disposed over the regions 76–78 in substrate 73. A conductive material 96 such as tungsten is then deposited over the device, and has portions 97–99 which respectively fill the recesses 91–93. The conductive material 96 is then planarized back to a level corresponding to surface 84 and the upper ends of the gate sections 81–82, using a known CMP technique or a known etching technique. The result leaves the device 71 as shown in FIG. 9, where the conductive portions 97–99 each engage the upper surface portion on a respective one of the regions 76–78 of substrate 73, and each have an upper end at a level corresponding to the upper ends of the gate sections 81–82 and the top surface 84 of the dielectric layer 83. The conductive portions 97–99 are each disposed immediately adjacent sidewalls of the gate sections 81–82, with no intervening dielectric material.

The conductive portions 97–99 each serve as a local interconnect or contact that provides an electrical path from a respective one of the regions 76–78 up to a metalization layer which will be added on top of the device during a subsequent stage of the fabrication process for device 71. As mentioned above, the process steps used for the embodiment of FIGS. 7–9 are the same as for the embodiment of FIGS. 1–5, but FIGS. 7–9 illustrate how a single etch region 87 may be used to form three or more local interconnects which are self-aligned.

Figure 10:
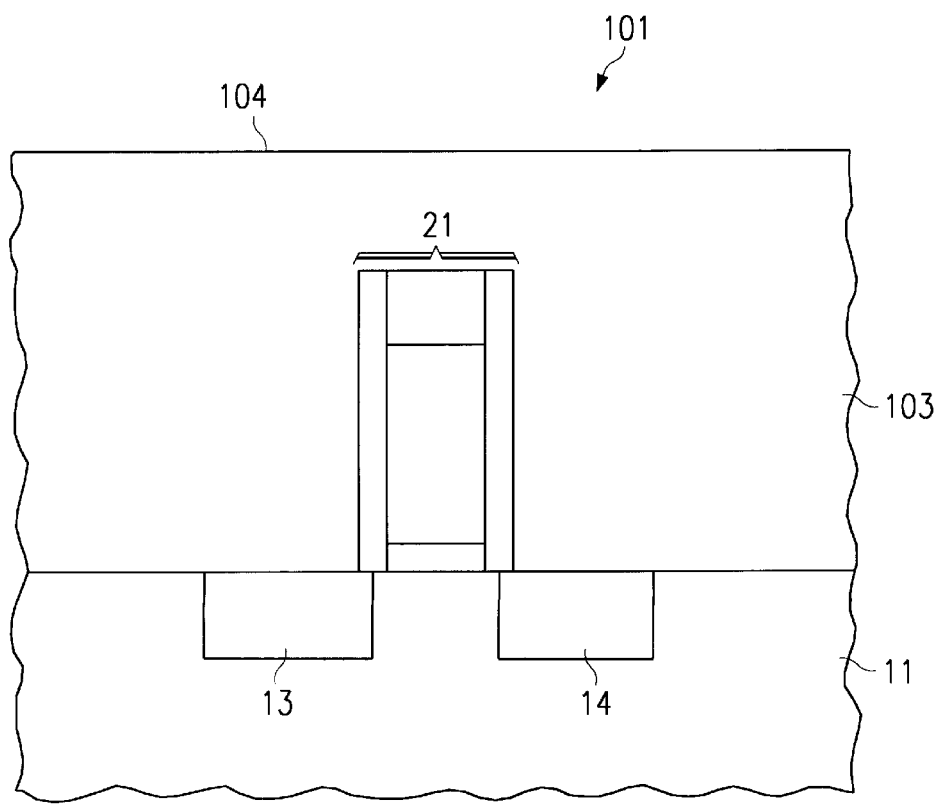
FIG. 10 is a diagrammatic sectional side view of a further integrated circuit which is an alternative embodiment of the integrated circuit of FIGS. 1–5 and which is fabricated according to a method that is an alternative embodiment of the method of FIGS. 1–5, the integrated circuit of FIG. 10 being shown at an intermediate stage during its fabrication.
Figure 11:
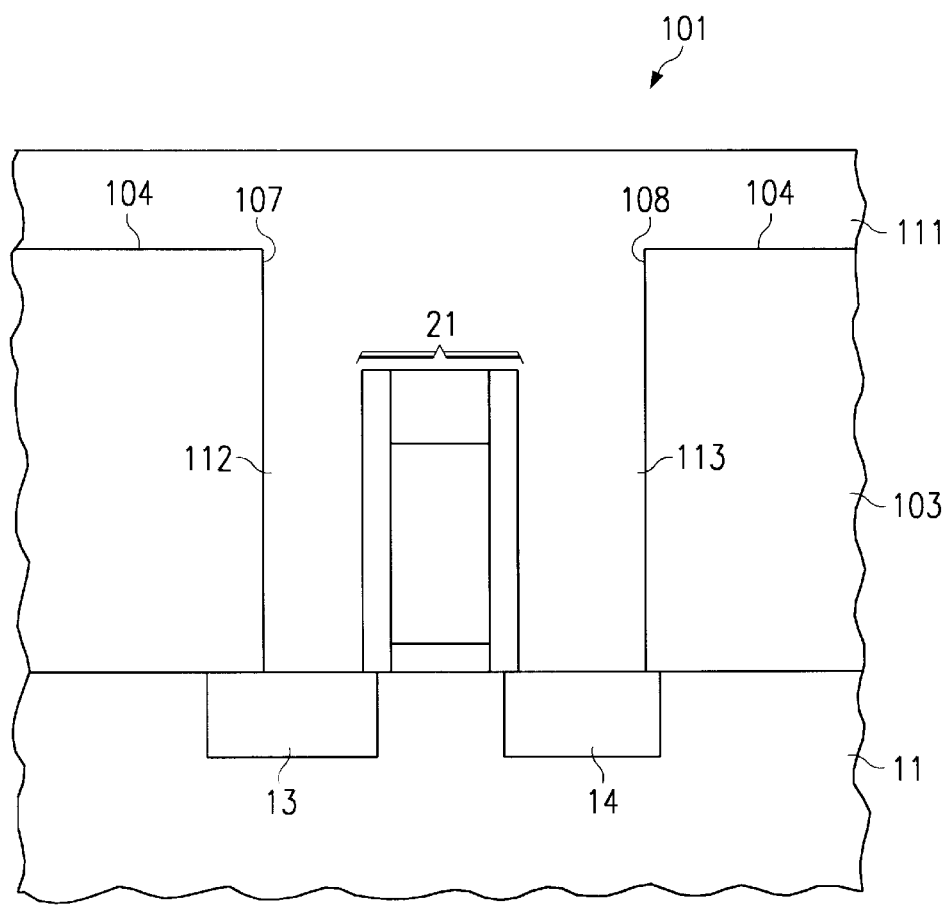
FIG. 11 is a diagrammatic sectional side view similar to FIG. 10, but showing the integrated circuit at a later stage during its fabrication process.

FIGS. 10 and 11 show a device 101 which is fabricated by a variation of the process described above in association with FIGS. 1–5. The device 101 includes a substrate 11, source and drain regions 13–14, and a gate section 21, which all correspond to their counterparts in the device 10 of FIG. 1. The device 101 further includes a PMD layer 103 of silicon dioxide, which corresponds functionally to the PMD layer 31 in the device 10 of FIG. 1. The primary difference is that the dielectric layer 103 is not planarized back to the level of the upper end of gate section 21 before carrying out the patterned etch. In particular, it will be noted in FIG. 10 that the upper surface 104 of the dielectric layer 103 is higher than the upper end of the gate section 21.

With the device 101 in the stage shown in FIG. 10, a patterned etch is carried out in a manner similar to that described above in association with FIG. 2, using a mask with an etch pattern which is the same as that shown at 36 in FIG. 2. With reference to FIG. 11, the result of the patterned etch is two recesses 107 and 108 in the dielectric layer 103, which respectively extend downwardly on opposite sides of the gate section 21 to the upwardly facing surface portions on top of the source and drain regions 13–14. It will be noted that the material of the dielectric layer 103 which is directly over the gate section 21 has also been etched away, but that the etch is selective and thus has not removed material from the gate section 21.

Next, a layer 111 of a conductive material such as tungsten is deposited on top of the device, and has portions 112 and 113 which are disposed in and fill the recesses 107–108. Thereafter, the upper side of the device 101 as depicted in FIG. 11 is planarized back to a level corresponding to the upper end of the gate section 21, resulting in a structural configuration which is identical to that shown in FIG. 5 and which is therefore not separately illustrated. This planarization may be carried out using either a known CMP technique or a known etching technique. It should be noted that this planarization not only removes material from the conductive layer 111, but also removes portions of the dielectric layer 103 which are higher than the upper end of the gate section 21.

Figure 12:
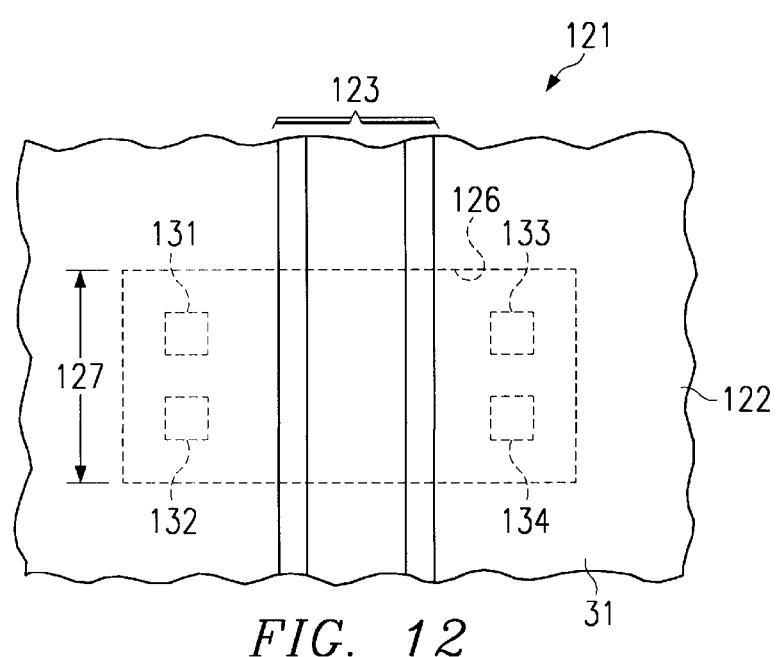
FIG. 12 is a diagrammatic top view of yet another integrated circuit which is an alternative embodiment of the integrated circuit of FIGS. 1–5 and which is fabricated according to a method that is an alternative embodiment of the method of FIGS. 1–5, FIG. 12 further depicting an etch mask used to fabricate the integrated circuit, the integrated circuit of FIG. 12 being shown at an intermediate stage during its fabrication.

FIG. 12 is a diagrammatic top view of a device 121 which is generally similar to and at the same stage of fabrication as the device 10 shown in the top view of FIG. 2. In particular, the device 121 includes a dielectric layer 122, and a gate section 123. The difference is that the etch region 126 has dimensions which are relatively large, for example as designated by arrow 127. If the lateral dimensions are less than about twice the thickness of the conductive material, then the conductive material will easily fill the recesses created in the dielectric layer 122 by the patterned etch. On the other hand, if a lateral dimension is greater than about twice the thickness of the conductive material, the layer of conductive material may not completely fill the recesses. Consequently, and especially if the planarization which removes the excess conductive material is an etching process, the recesses in the dielectric layer 122 will not be completely filled with conductive material at the end of the planarization.

Figure 13:
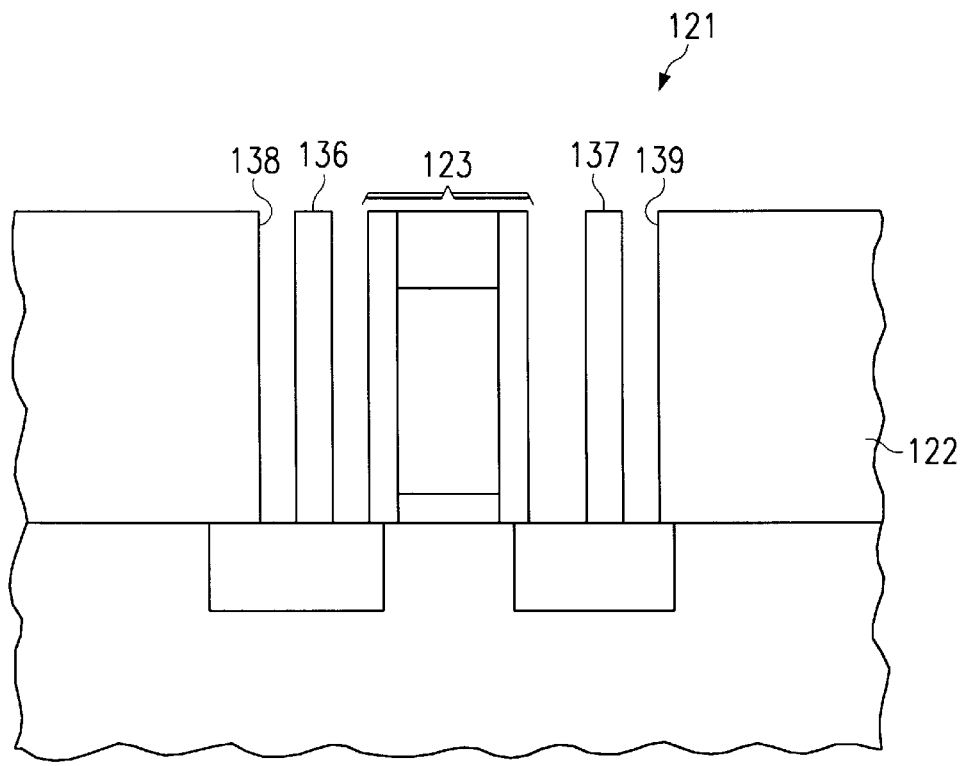
FIG. 13 is a diagrammatic sectional side view of the integrated circuit of FIG. 12, showing its configuration at a later stage during its fabrication.

With reference to FIG. 12, one technique for avoiding this problem is to provide one or more non-etch regions or islands 131–134 in each end portion of the etch region 126. These islands 131–134 are positioned so that they will be spaced from the gate section 123, even when the etch region 126 is misaligned with respect to the device 121. The result is that etching of the dielectric layer 122 will occur within the boundaries of the etch region 126, except where the non-etch islands 131–134 are provided. The material of the dielectric layer 122 immediately under each of the islands 131–134 will not be etched away, thereby leaving a respective vertical column or pillar of dielectric material under each of the islands 131–134. For example, FIG. 13 shows two of the pillars 136 and 137, which are created within the respective recesses 138 and 139 in the layer 122. Due to the presence of the pillars, the lateral dimensions between walls of the recesses 138–139 are effectively reduced. Consequently, the recesses 138–139 will be completely filled by the conductive layer, and thus will be properly filled following the subsequent planarization of the conductive material, even if the planarization is carried out using an etching technique.

Figure 14:
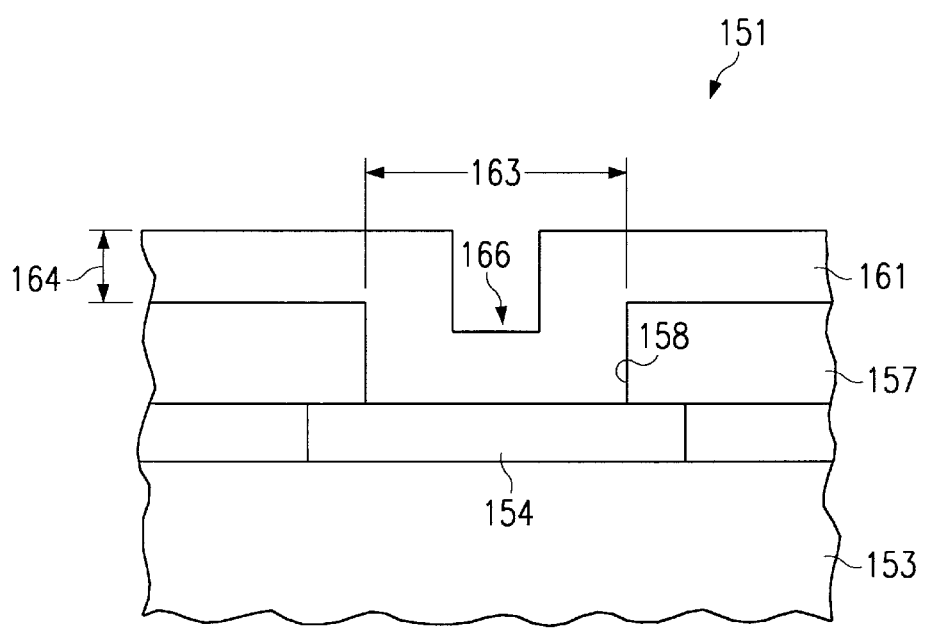
FIG. 14 is a diagrammatic sectional side view of still another integrated circuit which is an alternative embodiment of the integrated circuit of FIGS. 1–5 and which is fabricated according to a method that is an alternative embodiment of the method of FIGS. 1–5, FIG. 14 depicting the integrated circuit at an intermediate stage during its fabrication.

FIGS. 14–17 show another technique for dealing with the problem discussed above in association with FIGS. 12–13, namely where a recess has a lateral dimension which is greater than about twice the thickness of the conductive material which is to fill the recess. More specifically, FIG. 14 shows a device 151 that includes a substrate 153 of a p-type silicon material, and which contains an n+region 154. A dielectric layer 157 of silicon dioxide has been deposited on the substrate, and a recess 158 has been etched therein. A layer 161 of a conductive material such as tungsten has been deposited on top of the device. It will be noted that the width of the recess 158 is more than twice the thickness 164 of the conductive layer 161 of conductive material. It will further be noted that, at the center 166 of the recess, the top of the layer 161 is lower than the top of the dielectric layer 157. Consequently, when the conductive layer 161 is subsequently planarized back to the top of the dielectric layer 157, the recess 158 will not be completely filled with conductive material. This is particularly true where the planarization is carried out using an etching process, because the etching process itself will remove material from the center portion 166 of the recess 158, resulting in the configuration shown in FIG. 15.

Figure 15:
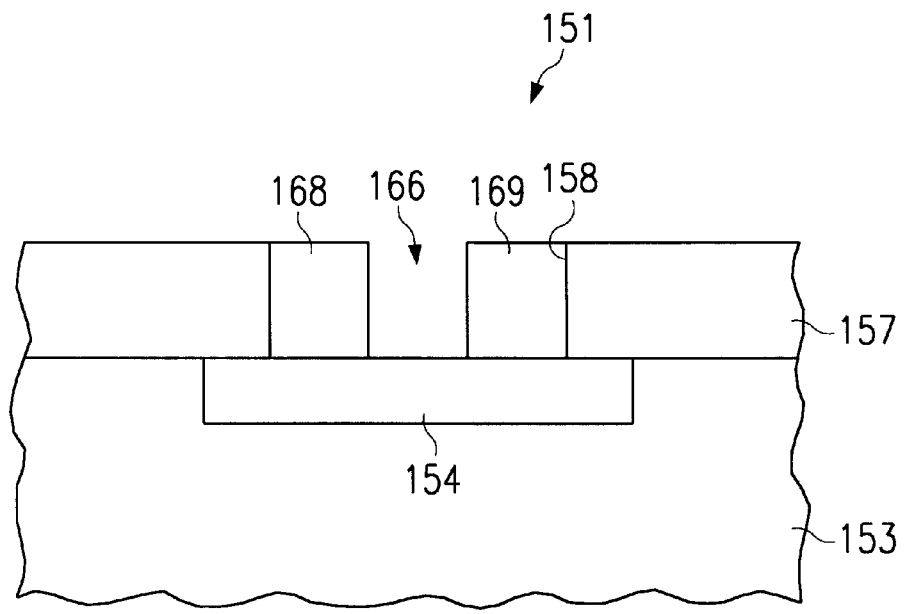
FIG. 15 a diagrammatic sectional side view similar to FIG. 14, but showing the integrated circuit at a later stage during its fabrication.
Figure 16:
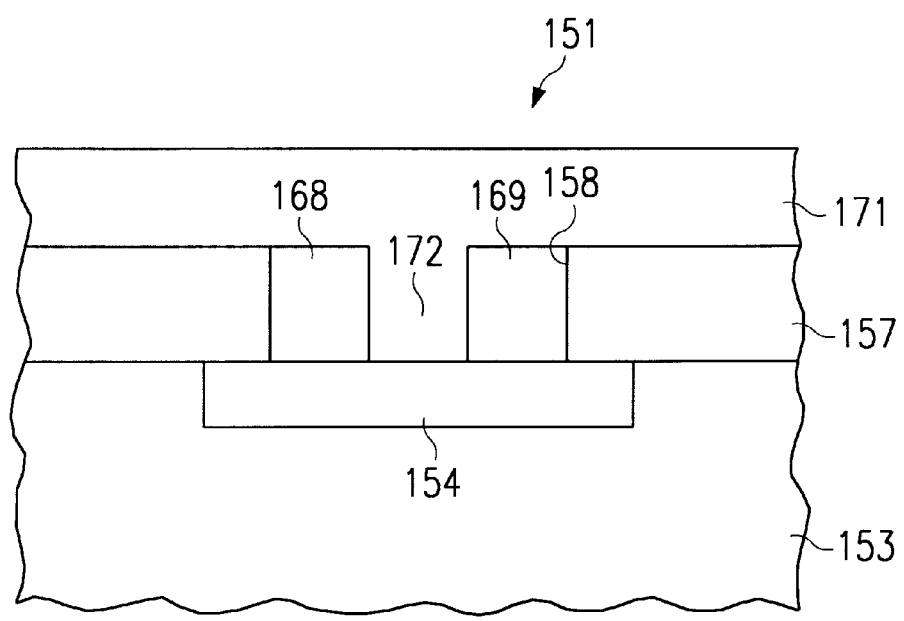
FIG. 16 is a diagrammatic sectional side view similar to FIG. 15, but showing the integrated circuit at yet a later stage during its fabrication.
Figure 17:
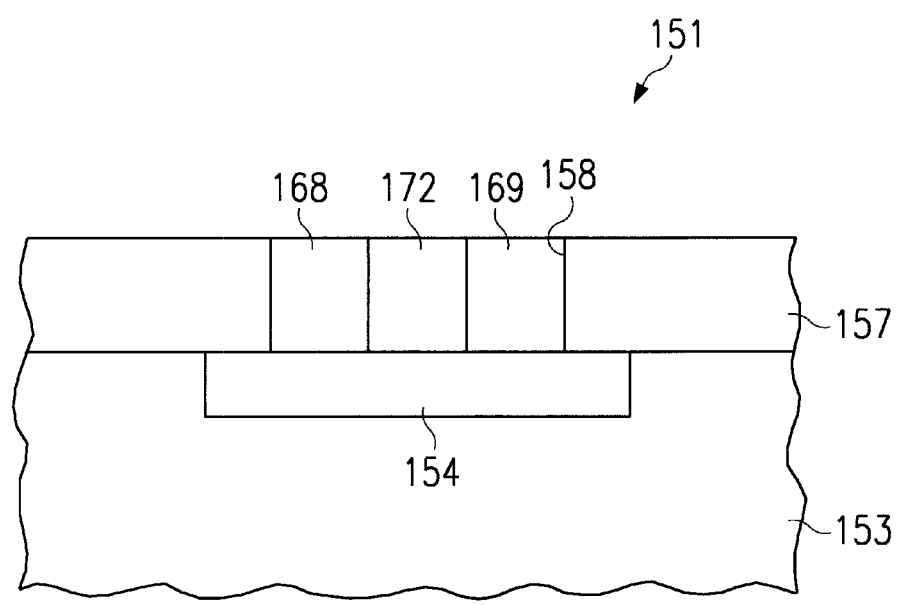
FIG. 17 is a diagrammatic sectional side view similar to FIG. 16, but showing the integrated circuit at a still late stage during its fabrication.

In particular, FIG. 15 shows that conductive portions 168 and 169 remain from the conductive layer 161, with a space therebetween. However, this remaining space has a width which is substantially less than the original width of the recess 158, and in particular is substantially less than twice the typical thickness of a deposited conductive layer, such as the thickness shown at 164 in FIG. 14. Consequently, a further layer 171 of a conductive material such as tungsten can be applied to the top of the device 151, as shown in FIG. 16, and will have a portion 172 which completely fills the center portion of the original recess 158. When the layer 171 is planarized back to the top surface of the dielectric layer 157, whether by an etching technique or a CMP technique, the result will be the device 151 shown in FIG. 17, where the recess 158 is completely filled by the portions of conductive material at 168–169 and 172.

Figure 18:
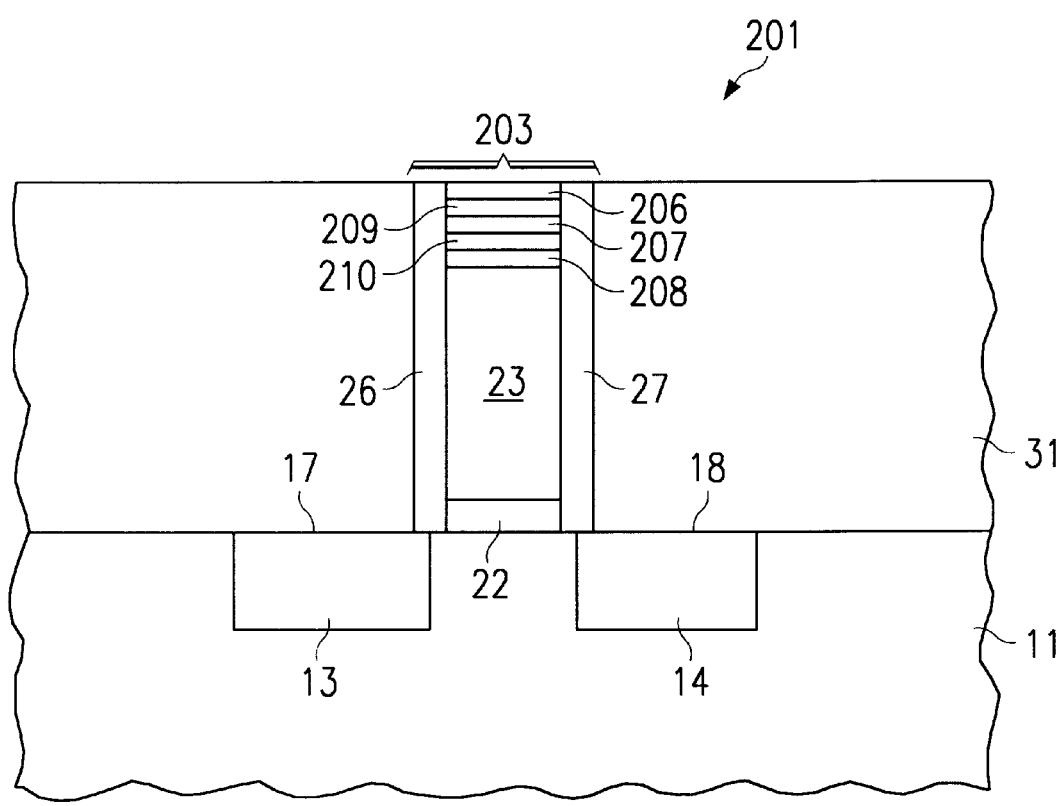
FIG. 18 is a diagrammatic sectional side view of an integrated circuit which is another alternative embodiment of the integrated circuit of FIGS. 1–5 and which is fabricated according to a method that is an alternative embodiment of the method of FIGS. 1–5, the integrated circuit of FIG. 18 including a gate section having at an upper end an insulating layer defined by alternating nitride layers and oxide layers, and being shown at an intermediate stage during its fabrication.

FIG. 18 is a diagrammatic sectional side view of a device 201 which is a variation of the device 10 shown in FIG. 1. In more detail, the device 201 is generally similar to the device 10 of FIG. 1, in that it includes a substrate 11 with spaced source and drain regions 13–14, a dielectric layer 31, and a gate section 203 between the regions 13–14. The device 201 differs from the device 10 of FIG. 1 in that the gate section 203 in FIG. 18 differs from the gate section 21 of FIG. 1. In more detail, the gate section 203 includes a gate dielectric layer 22, a gate electrode 23, and sidewalls 26–27, which are each structurally and functionally equivalent to their counterparts in FIG. 1. However, the insulating nitride layer 28 shown in FIG. 1 has been replaced with several alternating layers 206–210 of two different materials. In particular, the three layers 206–208 are insulating layers made of a nitride material such as $Si_3N_4$, and the two layers 209–210 are insulating layers made of an oxide material such as silicon dioxide. In FIG. 18, the oxide layers 209–210 have a slightly greater capacity for compression than the nitride layers 206–208. Consequently, when a CMP planarization is being carried out and is applying a mechanical force to the upper end of the gate section 203, the oxide layers 209–210 will tend to absorb some or all the mechanical force, so that the entire force is not transferred through the gate electrode 23 to the gate dielectric layer 22, which in turn reduces the risk of possible damage to the gate dielectric layer 22 during a CMP process step. During further fabrication, the device 201 of FIG. 18 would be processed in a manner similar to that described above for the device 10 in association with FIGS. 2–5.

The present invention provides a number of technical advantages. One such technical advantage is that two local interconnects such as contacts can be fabricated on opposite sides of a gate section so that they are both immediately adjacent the gate section, or in other words so that there is no space between the gate section and either contact. Since each local interconnect is immediately adjacent the gate section, the requisite contact area between each local interconnect and the associated source or drain region can be ensured with a smaller source or drain region than was required for preexisting techniques. By reducing the size of the source and drain regions, the overall size of an integrated circuit can be reduced, thereby resulting in higher circuit densities within the integrated circuit. Further, reducing the sizes of the source and drain regions reduces the sizes of the associated junction areas in the semiconductor substrate, as well as junction capacitances, junction resistances, and junction leakage currents.

A further advantage is that a single etch region can be used to form two or more local interconnects, all of which are self-aligned with respect to one or more gate sections. A further advantage is that the method according to the invention can be implemented without any more process steps than are required for a preexisting process. Still another advantage is that techniques are provided to completely fill recesses with a conductive material, even where the recesses are relatively wide in relation to the thickness of the layer of conductive material which is applied to fill them. Yet another advantage is that an insulating arrangement which caps the upper end of a gate section can involve alternating layers of two materials such as a nitride and an oxide, in order to help absorb mechanical forces applied during CMP planarization, and thereby better protect the gate dielectric layer which underlies the gate electrode.

Although several exemplary embodiments have been illustrated and described in detail, it should be understood that there are substitutions and alterations which can be made without departing from the scope of the present invention. For example, the foregoing discussion sets forth exemplary materials which can be used for the various parts of the disclosed devices, but it will be recognized that there are other suitable materials which could be substituted for some or all of the disclosed materials, without departing from the present invention.

Further, the present invention has been disclosed in the specific context of a particular type of MOSFET component, but it will be recognized that the techniques of the present invention can be used in association with other types of components. Moreover, the etch regions disclosed in the present application have been depicted as being generally rectangular, but it will be recognized that there are other shapes which could be used and which are encompassed by the present invention. Other substitutions and alterations are also possible without departing from the spirit and scope of the present invention, as defined by the following claims.

What is claimed is:

1. A method of making a semiconductor device, comprising the steps of:

fabricating a structure that has laterally spaced first and second sections with respective upwardly facing first and second surface portions thereon, and that has a third section projecting upwardly beyond each of said first and second surface portions from a location therebetween;

forming on said structure an insulating layer which has portions disposed over said first and second surface portions, said third section extending into said insulating layer;

effecting a patterned etching of an upper side of said insulating layer using an etch pattern, said etch pattern including an etch region which extends from a location disposed over said first surface portion to a location disposed over said second surface portion, wherein etching in said etch region creates first and second recess portions which respectively extend downwardly through said insulating layer toward said first and second surface portions on opposite sides of said third section;

depositing a conductive material into said first and second recess portions; and planarizing an upper side of said device at least to a level corresponding to an upper end portion of said third section.

2. A method according to claim 1, wherein at the start of said step of effecting a patterned etch, an upper surface of said insulating layer is higher than an upper end of said third section.

3. A method according to claim 1 including, prior to said step of effecting a patterned etch, the step of planarizing said insulating layer to a level corresponding substantially to an upper end of said third section.

4. A method according to claim 1, wherein said depositing step includes the steps of depositing a first layer of said conductive material, planarizing said first layer by etching said first layer, and thereafter depositing a second layer of said conductive material.

5. A method according to claim 1, wherein said planarizing step leaves respective portions of said conductive material in each of said first and second recess portions, said portions of said conductive material each serving as a local interconnect through said insulating layer with respect to a respective one of said first and second sections.

6. A method according to claim 1, wherein said fabricating step includes the step of forming spaced source and drain regions in a semiconductor substrate, said source and drain regions being said first and second sections, and forming on said substrate between said source and drain regions a gate section which includes a gate dielectric layer, a gate electrode over said gate dielectric layer, an insulator layer over said gate electrode, and insulator sidewalls on opposite sides of said gate dielectric layer, said gate electrode and said insulating layer, said gate section being said third section.

7. A method according to claim 6, including after said step of forming said insulator layer, the step of creating an opening through said insulator layer.

8. A method according to claim 6, wherein said step of forming said insulator layer on said gate electrode is carried out by forming alternating layers of a nitride material and an oxide material.

9. A method according to claim 1, wherein said etch pattern has at least one etch-resistant island provided within said etch region and disposed above one of said first and second surface portions.

10. A method of making a semiconductor device, comprising the steps of:
fabricating a structure having laterally spaced first, second and third sections with respective upwardly facing first, second and third surface portions thereon, said second section being disposed between said first and third sections, said structure further having a fourth section projecting upwardly beyond each of said first and second surface portions from a location therebetween, and a fifth section projecting upwardly beyond each of said second and third surface portions from a location therebetween;

forming on said structure an insulating layer which has portions disposed over each of said first, second and third surface portions, said third and fourth sections extending into said insulating layer;

effecting a patterned etching of an upper side of said insulating layer using an etch pattern, said etch pattern including an etch region which extends from a location disposed over said first surface portion through a location disposed over said second surface portion to a location disposed over said third surface portion, wherein etching in said etch region creates a first recess portion which extends downwardly through said insulating layer toward said first surface portion adjacent said fourth section, a second recess portion which extends downwardly through said insulating layer toward said second surface portion adjacent said fourth and fifth sections, and a third recess portion which extends downwardly through said insulating layer toward said third surface portion adjacent said fifth section;

depositing a conductive material into said first, second and third recess portions; and planarizing an upper side of said device at least to a level corresponding to upper end portions of said fourth and fifth sections.

11. A method according to claim 10, wherein at the start of said step of effecting a patterned etch, an upper surface of said insulating layer is higher than upper ends of said fourth and fifth sections.

12. A method according to claim 10 including, prior to said step of effecting a patterned etch, the step of planarizing said insulating layer to a level corresponding substantially to upper ends of said fourth and fifth sections.

13. A method according to claim 10, wherein said depositing step includes the steps of depositing a first layer of said conductive material, planarizing said first layer by etching said first layer, and thereafter depositing a second layer of said conductive material.

14. A method according to claim 10, wherein said planarizing step leaves respective portions of said conductive material in each of said first, second and third recess portions, said portions of said conductive material each serving as a local interconnect through said insulating layer with respect to a respective one of said first, second and third sections.

15. A method according to claim 10, wherein said fabricating step includes the steps of:
forming spaced source and drain regions in a semiconductor substrate, each of said first, second and third sections being a respective one of said source and drain regions;

forming said fourth section by forming on said substrate between said first and second regions a first gate dielectric layer, forming a first gate electrode over said first gate dielectric layer, forming a first insulator layer over said first gate electrode, and forming first insulator sidewalls on opposite sides of said first gate dielectric layer, said first gate electrode and said first insulating layer; and forming said fifth section by forming on said substrate between said second and third regions a second gate dielectric layer, forming a second gate electrode over said second gate dielectric layer, forming a second insulator layer over said second gate electrode, and forming second insulator sidewalls on opposite sides of said second gate dielectric layer, said second gate electrode and said second insulating layer.

16. A method according to claim 15, wherein said step of forming each of said first and second insulator layers is carried out by forming alternating layers of a nitride material and an oxide material.

17. A method according to claim 11, wherein said etch pattern has at least one etch-resistant island provided within said etch region and disposed above one of said first, second and third surface portions.

* * * * *